(12) United States Patent
Kumagai (10) Patent No.: US 9,707,993 B2
(45) Date of Patent: Jul. 18, 2017

(54) ELECTRIC POWER STEERING APPARATUS

(71) Applicant: NSK LTD., Tokyo (JP)

(72) Inventor: Shin Kumagai, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 14/782,089

(22) PCT Filed: Apr. 20, 2015

(86) PCT No.: PCT/JP2015/061956
§ 371 (c)(1),
(2) Date: Oct. 2, 2015

(87) PCT Pub. No.: WO2015/182287
PCT Pub. Date: Dec. 3, 2015

(65) Prior Publication Data
US 2017/0072995 A1    Mar. 16, 2017

(30) Foreign Application Priority Data

May 29, 2014  (JP) .................................. 2014-111230

(51) Int. Cl.
*B62D 11/00*  (2006.01)
*B62D 5/04*  (2006.01)
(Continued)

(52) U.S. Cl.
CPC ............. *B62D 5/0463* (2013.01); *B62D 5/04* (2013.01); *B62D 6/00* (2013.01); *H02P 23/00* (2013.01);
(Continued)

(58) Field of Classification Search
CPC ...... B62D 5/0463; B62D 6/00; B62D 5/0493; H02P 23/0004; H02P 27/08; H02P 27/06
(Continued)

(56) References Cited

U.S. PATENT DOCUMENTS 7,161,323 B2 *  1/2007  Ajima .................... B62D 5/046
                                                                   318/560
8,798,863 B2 *  8/2014  Hisazumi ............. B62D 5/0493
                                                                   701/41
(Continued)

FOREIGN PATENT DOCUMENTS

JP    2007-110814 A    4/2007
JP    2008-236975 A    10/2008
JP    2009-55693 A    3/2009

OTHER PUBLICATIONS

Namuduri et al., High power density electric drive for an hybrid electric vehicle, 1998, IEEE, p. 34-40.*
(Continued)

*Primary Examiner* — McDieunel Marc
(74) *Attorney, Agent, or Firm* — Sughrue Mion, PLLC (57) ABSTRACT

An electric power steering apparatus, without outside attachment circuit, that is capable of simultaneously sampling two phases of which the duties are not saturated and of cheaply detecting the 3-shunt currents by using two A/D converting units in correspondence to the duty saturation phase (the maximum phase) changing when the motor is rotated. The apparatus calculates a current command value due to at least a steering torque, performs a PWM-control of a 3-phase motor through an inverter based on the current command value, and assist-controls a steering system of a vehicle by detecting currents of the 3-phase motor and feed-backing.

12 Claims, 8 Drawing Sheets

(51) Int. Cl.
    *B62D 6/00*     (2006.01)
    *H02P 23/00*     (2016.01)
    *H02P 27/08*     (2006.01)

(52) U.S. Cl.
    CPC .......... *H02P 23/0004* (2013.01); *H02P 27/08* (2013.01)

(58) Field of Classification Search
    USPC ..................................................... 701/41, 42
    See application file for complete search history.

(56) References Cited

U.S. PATENT DOCUMENTS

| | | | | |
|---|---|---|---|---|
| 8,981,687 B2* | 3/2015 | Kuroda | ................... | H02P 27/06 318/400.02 |
| 9,362,860 B2* | 6/2016 | Sugawara | ............... | B62D 5/046 |
| 9,371,087 B2* | 6/2016 | Suzuki | ................. | B62D 5/046 |
| 9,444,369 B2* | 9/2016 | Suzuki | ................. | B62D 5/0472 |
| 9,520,817 B2* | 12/2016 | Suzuki | ................. | B62D 5/0463 |
| 9,531,305 B2* | 12/2016 | Ajima | ....................... | H02P 6/10 |

OTHER PUBLICATIONS

Kumar et al., Four Quadrant Comparative Evaluation of Classical and Space Vector PWM-DirectTorque Control of a VSI fed Three Phase Induction Motor Drive in MATLAB/SIMULINK Environment, 2012, IEEE, p. 1-6.*

Shetty et al., Modeling and simulation of the complete electricpower train of a Hybrid electric vehicle, 2014, IEEE,. p. 1-5.*

Wilson et al., Performance Investigation of DSP Based Self-Controlled PMSM Drive, 2012, IEEE, p. 238-243.*

Written Opinion of PCT/JP2015/061956, dated Jul. 21, 2015. [PCT/ISA/237].

\* cited by examiner

ELECTRIC POWER STEERING APPARATUS

CROSS REFERENCE TO RELATED APPLICATIONS

This application is a National Stage of International Application No. PCT/JP2015/061956 filed Apr. 20, 2015, claiming priority based on Japanese Patent Application No. 2014-111230, filed May 29, 2014, the contents of all of which are incorporated herein by reference in their entirety.

TECHNICAL FIELD

The present invention relates to an electric power steering apparatus that calculates a current command value due to at least a steering torque, performs a PWM-control of a 3-phase motor through an inverter based on the current command value, and assist-controls a steering system of a vehicle by detecting currents of the 3-phase motor and feed-backing, and in particular to an electric power steering apparatus that outside attachment circuit(s) is useless and cheap and that is capable of detecting 3-phase motor currents with a down-stream 3-shunt type of the inverter.

BACKGROUND ART

An electric power steering apparatus which provides a steering mechanism of a vehicle with a steering assist torque (an assist torque) by means of a rotational torque of a motor, applies a driving force of the motor as the assist torque to a steering shaft or a rack shaft by means of a transmission mechanism such as gears or a belt through a reduction mechanism. In order to accurately generate the assist torque, such a conventional electric power steering apparatus (EPS) performs a feedback control of a motor current. The feedback control adjusts a voltage supplied to the motor so that a difference between a steering assist command value (a current command value) and a detected motor current value becomes small, and the adjustment of the voltage applied to the motor is generally performed by an adjustment of a duty ratio of a pulse width modulation (PWM) control.

Figure 1:
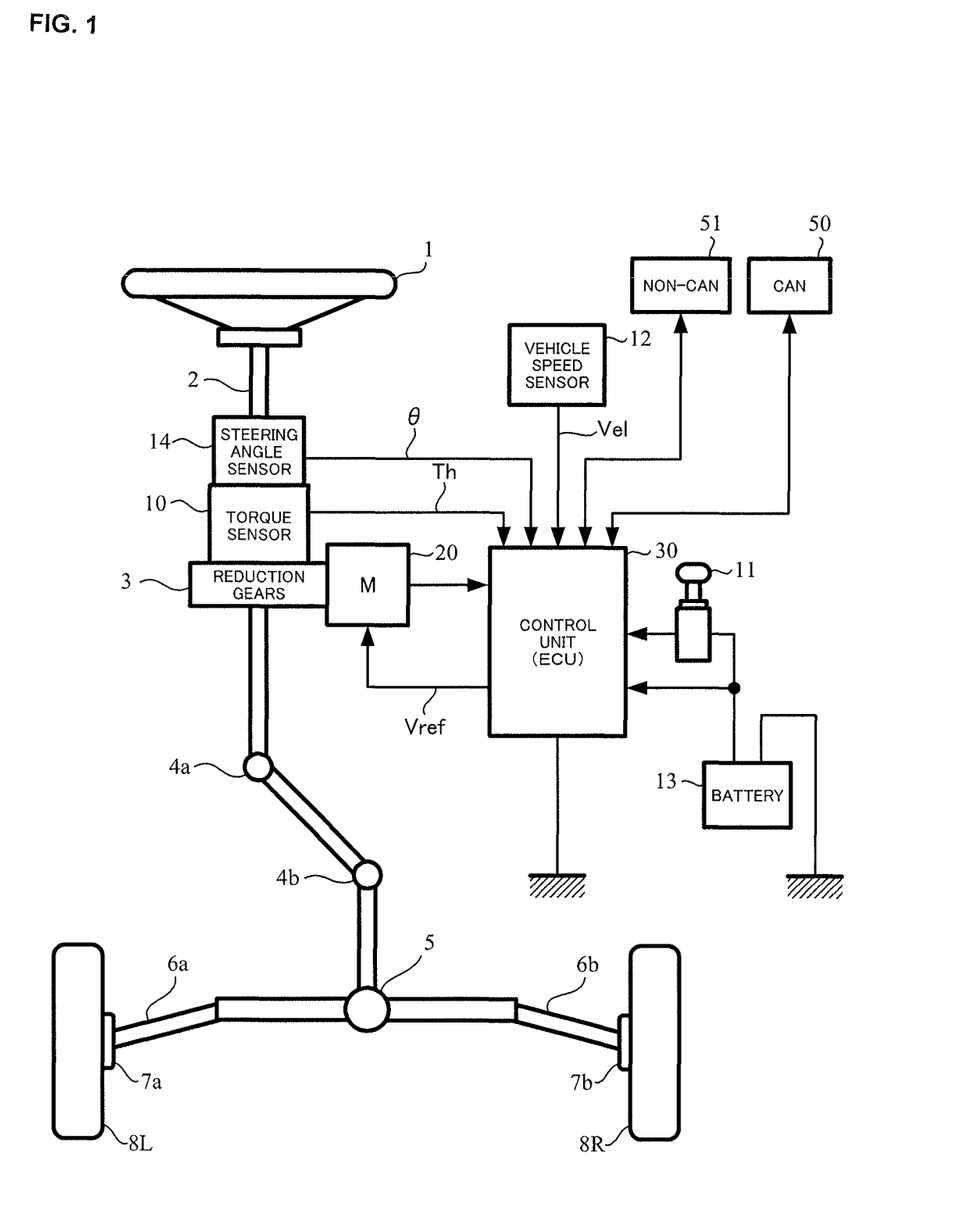
FIG. 1 is a diagram showing a configuration example of a general electric power steering apparatus.

A general configuration of a conventional electric power steering apparatus will be described with reference to FIG. 1. As shown in FIG. 1, a column shaft (a steering shaft) 2 connected to a steering wheel (a handle) 1, is connected to steered wheels 8L and 8R through reduction gears 3, universal joints 4a and 4b, a rack and pinion mechanism 5, and tie rods 6a and 6b, further via hub units 7a and 7b. Further, the column shaft 2 is provided with a torque sensor 10 for detecting a steering torque Th of the steering wheel 1, and a motor 20 for assisting the steering force of the steering wheel 1 is connected to the column shaft 2 through the reduction gears 3. Electric power is supplied to a control unit (ECU) 30 for controlling the electric power steering apparatus from a battery 13, and an ignition key signal is inputted into the control unit 30 through an ignition key 11. The control unit 30 calculates a current command value of an assist (steering assist) command based on a steering torque Th detected by the torque sensor 10 and a vehicle speed Vel detected by a vehicle speed sensor 12, and controls a current supplied to the motor 20 based on a voltage control command value Vref obtained by performing compensation and so on with respect to the current command value. Moreover, a steering angle sensor 14 is not essential and it also may be not to provide.

A controller area network (CAN) 50 to send/receive various information and signals on the vehicle is connected to the control unit 30, and it is also possible to receive the vehicle speed Vel from the CAN. Further, a Non-CAN 51 is also possible to connect to the control unit 30, and the Non-CAN 51 sends and receives a communication, analogue/digital signals, electric wave or the like except for the CAN 50.

Figure 2:
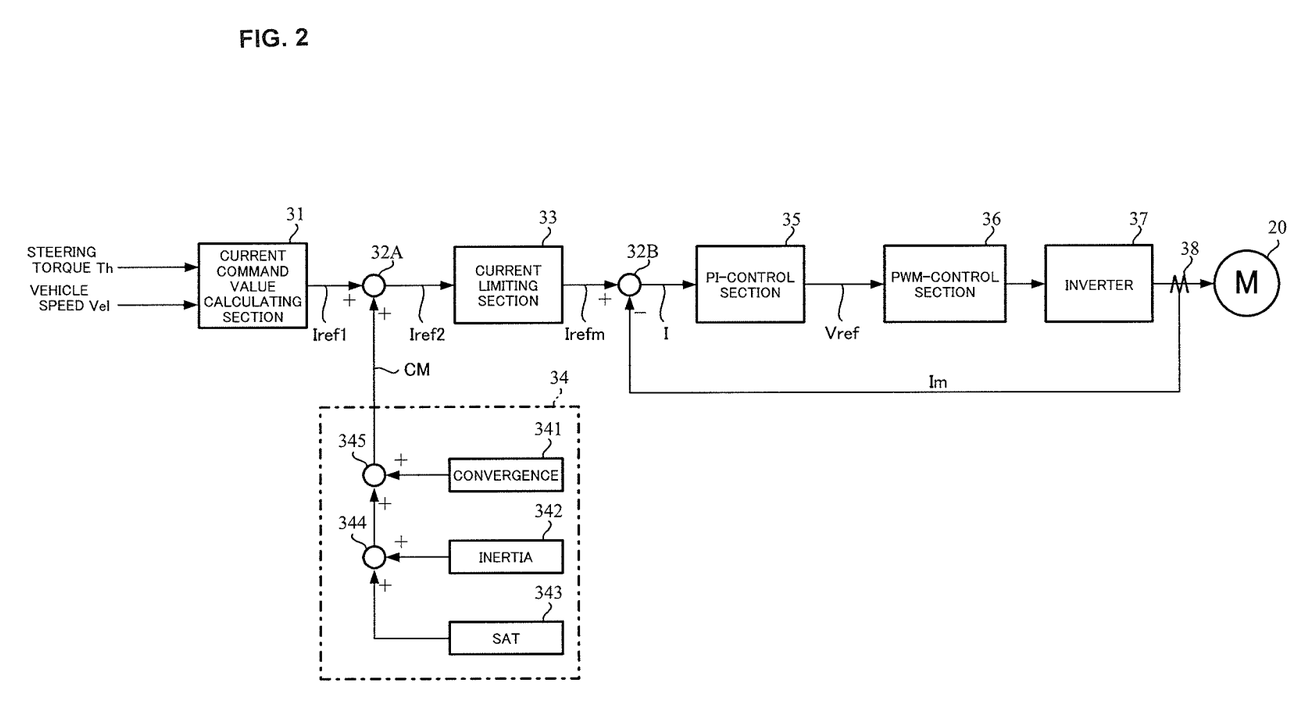
FIG. 2 is a block diagram showing one example of a control unit.

The control unit 30 mainly comprises a CPU (or an MPU or an MCU), and general functions performed by programs within the CPU are shown in FIG. 2.

Functions and operations of the control unit 30 will be described with reference to FIG. 2. As shown in FIG. 2, the steering torque Th detected by the torque sensor 10 and the vehicle speed Vel from the vehicle speed sensor 12 (or, from the CAN 50) are inputted into a current command value calculating section 31 to calculate a current command value Iref1. The current command value calculating section 31 calculates the current command value Iref1, which is a control target value of a current to supply to the motor 20, by means of an assist map or the like based on the steering torque Th and the vehicle speed Vel. The calculated current command value Iref1 is inputted into a current limiting section 33 through a subtracting section 32A and a current command value Irefm of which a maximum current is limited, is inputted into a subtracting section 32B. In the subtracting section 32B, a deviation (error) I (=Irefm−Im) between the limited current command value Irefm and a motor current value Im being fed-back is calculated, and the deviation I is inputted into a PI-control section 35 to improve a characteristic of the steering operation. The voltage control command value Vref of which the characteristic is improved is inputted into the PWM-control section 36, and further the motor 20 is PWM-driven through the inverter 37 as a driving section. The motor current Im is detected by a motor current detector 38 and the detected motor current Im is fed-back to the subtracting section 32B. The inverter 37 uses FETs as driving elements and comprises a bridge circuit of the FETs.

Further, a compensation signal CM from a compensating section 34 is added to the adding section 32A, which performs compensation of a system by adding the compensation signal CM and improves convergence, an inertial characteristic and so on. The compensating section 34 adds a self-aligning torque (SAT) 343 and the inertia 342 by an adding section 344, moreover, adds the convergence 341 to an addition result by an adding section 345, and makes the compensation signal CM of the addition result of the adding section 345.

Figure 3:
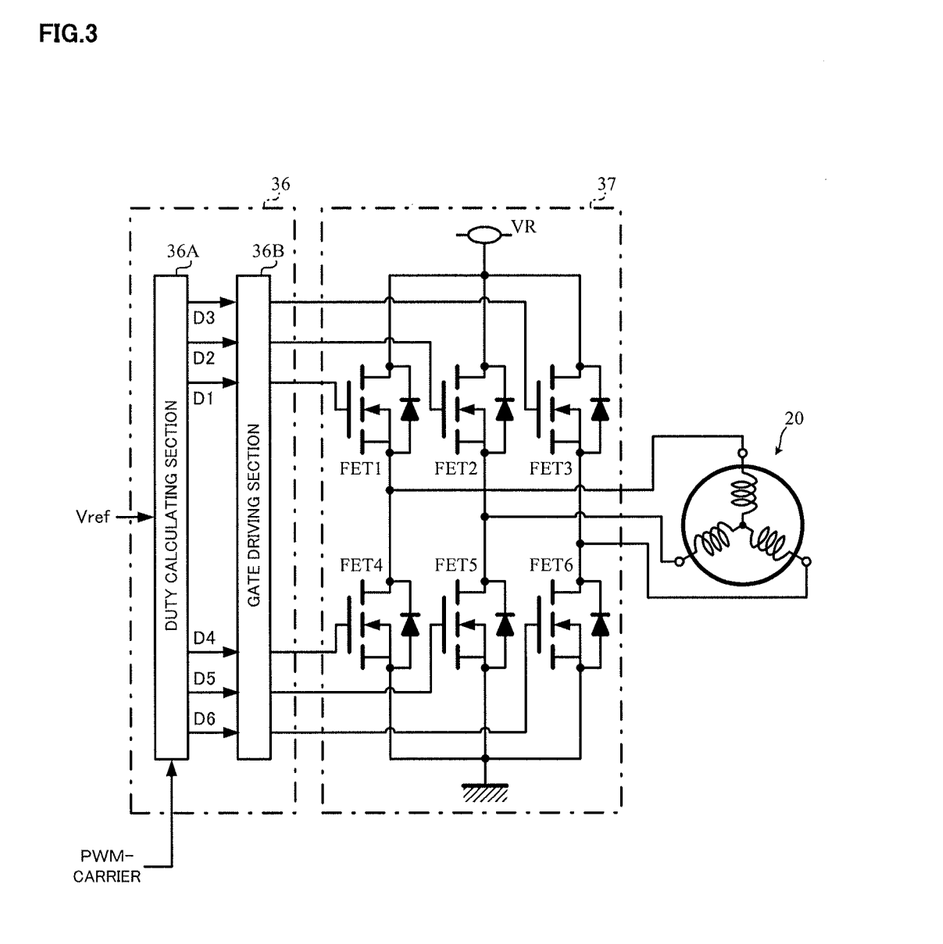
FIG. 3 is a diagram showing a configuration example of the PWM-control section and the inverter.

In the case that the motor 20 is a three-phase (U-phase, V-phase and W-phase) brushless DC-motor, details of the PWM-control section 36 and the inverter 37 is a configuration such as shown in FIG. 3. That is, the PWM-control section 36 comprises a duty calculating section 36A that calculates PWM-duty command values D1 to D6 of three phases (U-phase, V-phase and W-phase) in synchronous with a PWM-carrier CS by using a predetermined expression based on the voltage control command value Vref, and a gate driving section 36B that drives respective gates of the FET1 to FET6 by the PWM-duty command values D1 to D6, compensates dead times and turns ON/OFF. The inverter 37 comprises a three-phase bridge (High-side FET1 to FET3 and Low-side FET4 to FET6) and drives the motor 20 by being ON/OFF-operated with the PWM-duty command values D1 to D6.

Figure 4:
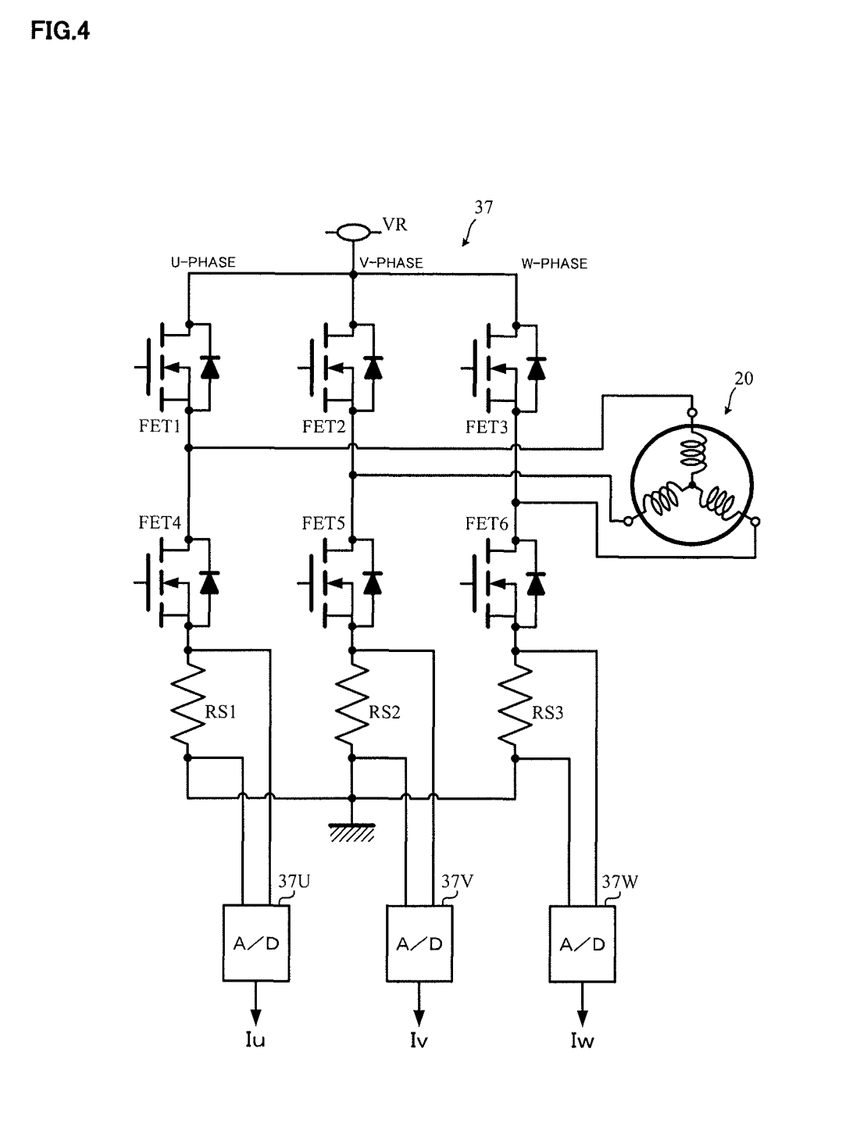
FIG. 4 is a diagram showing a configuration example of the current detection system.

In such the electric power steering apparatus, it is necessary to detect the respective phase currents of the motor 20 and to feedback, and a current detecting circuit of three-shunt type as shown in FIG. 4 is well known. That is, shunt resistances RS1 to RS3 are respectively inserted at downstream three-phases in the inverter 37, fall voltages due to the shunt resistances RS1 to RS3 are measured, the measured voltages are respectively converted into digital values at A/D converters 37U to 37W and simultaneously converted into current values, and detected three-phase motor currents Iu to Iw are fed back.

In the current detecting system of the down-stream three-shunts, it is necessary to detect at least two-phase currents with a simultaneous sampling at a timing when the Low-side FETs are "ON". If the two-phase currents could be detected, it is possible to detect the rest one-phase current due to a relation "Iu+Iv+Iw=0". Further, in a case that the duty is saturated (maximum) (ON-time of the Low-side FET is minimum), there is a possibility that its phase current detection becomes impossible due to that a current does not flow in the shunt resistances of the Low-side. Thus, under the consideration of the detection property at a time of the duty saturation, it is necessary to detect at least the two-phase currents of which the duties are not saturated, by judging a phase that the duty changing during the motor rotation is saturated.

For satisfying the above conditions, the following methods (1) to (4) are generally performed:

(1) A method to provide three A/D converters within an MCU as shown in FIG. 4, to input 3-phase detected-currents into respective individual units, and to simultaneously sample 2-phase currents detected-signals of which the duties are not saturated.

(2) A method to provide two A/D converters within an MCU, to provide a multiplexer outside of the MCU, to output 2-phase current detected-signals of which the duties are not saturated among 3-phases, to individual units within the MCU, and to simultaneously sample the 2-phase current detected-signals.

(3) A method to adopt an A/D converter with a sample-hold circuit and to simultaneously sample-hold 3-phase current detected-signals being connected to the A/D converter and to detect.

(4) A method to provide a sample-hold circuit outside of an MCU and to A/D-converts 3-phase current detected-signals which are simultaneously sample-held at a predetermined timing.

THE LIST OF PRIOR ART DOCUMENTS

Patent Documents

Patent Document 1: Japanese Published Unexamined Patent Application No. 2007-110814 A

SUMMARY OF THE INVENTION

Problems to be Solved by the Invention

According to the above method (1), since it is necessary to provide the three A/D converters, there is a problem to become a cost-up of the MCU. Further, since the above methods (2) and (3) need the outside attachment circuit(s), it becomes a cost-up and there is a problem to insure a space for parts arrangement. Furthermore, since the above method (4) uses the A/D converter with sample-hold circuit, accuracy on A/D conversion is inferior and there are problems that a current detecting accuracy becomes low and the cost increases.

In a current detection of the down-stream three-shunts, a method to accurately detect motor-phase currents even if PWM-duty value becomes a vicinity of 100% is disclosed in, for example, Japanese Published Unexamined Patent Application No. 2007-110814 A (Patent Document 1). However, Patent Document 1 does not disclose a current detecting method and the timing of the A/D conversion (sampling).

The present invention has been developed in view of the above-described circumstances, and an object of the present invention is to provide an electric power steering apparatus, without outside attachment circuit(s) such as the sample-hold circuit, that is capable of simultaneously sampling two phases of which the duties are not saturated and of cheaply detecting the 3-shunt currents by using two A/D converting units in correspondence to the duty saturation phase (the maximum phase) changing when the motor is rotated.

Means for Solving the Problems

The present invention relates to an electric power steering apparatus that calculates a current command value due to at least a steering torque, performs a PWM-control of a 3-phase motor through an inverter based on said current command value, and assist-controls a steering system of a vehicle by detecting currents of said 3-phase motor and feed-backing, the above-described object of the present invention is achieved by that comprising: a current detecting circuit to detect 3-phase currents of down-stream 3-shunts of said inverter; and two A/D converting units having a common channel and inputting 3-phase current detected-signals from said current detecting circuit; wherein said electric power steering apparatus includes a current detecting system that any one of said 3-phase current detected-signals is inputted into said common channel and current detected-signals of rest 2-phase are respectively inputted into other channel of said A/D converting units.

The above-described object of the present invention is more effectively achieved by that wherein said electric power steering apparatus further including a maximum-phase detecting section to detect a duty maximum-phase of said PWM-control and a switching section to switch inputs into said two A/D converting units of said 3-phase current detected-signals, wherein said switching section is switched based on a detection result of said maximum-phase detecting section, and two signals of said 3-phase current detected-signals corresponding to two phases except for said maximum-phase are respectively inputted into two A/D converters within said two A/D converting units and simultaneously sampled; or wherein a current of another one phase from said 2-phase current detected-signals is calculated, and motor current detected-values of three phases are outputted; or wherein said current detecting circuits respectively comprise an operational amplifier and resistance circuits to convert fall currents of down-stream shunt-resistances into current values and to output said current detected-signals; or wherein low pass filters (LPFs) are connected to respective output sections of said 3-phase current detected-signals.

Effects of the Invention

According to the electric power steering apparatus of the present invention, there are provided a current detecting circuit to detect 3-phase currents of down-stream 3-shunts of an inverter; and two A/D converting units having a common channel and inputting 3-phase current detected-signals from the current detecting circuit; wherein any one of the 3-phase current detected-signals is inputted into a common channel and current detected-signals of rest 2-phase are respectively inputted into other channel of the A/D converting units.

Therefore, it is possible to accurately detect the motor currents of the three phases with a cheap configuration.

Further, according to the electric power steering apparatus of the present invention, without outside attachment circuit(s) such as the sample-hold circuit and in correspondence to the duty saturation phase (the maximum phase) changing when the motor is rotated, it is possible to simultaneously sample two phases except for a phase of which the duty is maximum and to cheaply detect the 3-shunt currents by using two A/D converting units.

MODE FOR CARRYING OUT THE INVENTION

The present invention relates to an electric power steering apparatus that calculates a current command value due to at least a steering torque, performs a PWM-control of a 3-phase motor through an inverter based on the current command value, and assist-controls a steering system of a vehicle by detecting currents of the 3-phase motor and feed-backing. The electric power steering apparatus according to the present invention comprises a current detecting circuit to detect 3-phase currents of down-stream 3-shunts of the inverter and two A/D converting units having a common channel and inputting 3-phase current detected-signals from the current detecting circuit, and further includes a current detecting system that any one of the 3-phase current detected-signals is inputted into the common channel and current detected-signals of rest 2-phases are respectively inputted into other channel of the A/D converting units.

Further, in the present invention, there are provided a maximum-phase detecting section to detect a duty maximum-phase (High-side) of the PWM-control and a switching section to switch inputs into the two A/D converting units of the 3-phase current detected-signals. The switching section is switched based on a detection result of the maximum-phase detecting section, and two signals of the 3-phase current detected-signals corresponding to two phases except for the maximum-phase are inputted into two A/D converters within the two A/D converting units and simultaneously sampled. With respect to another one phase, the current is calculated by a current calculation and it is fed back by outputting the motor current detected-signals of the three-phases.

Hereinafter, embodiments of the present invention will be described in detail with reference to drawings.

Figure 5:
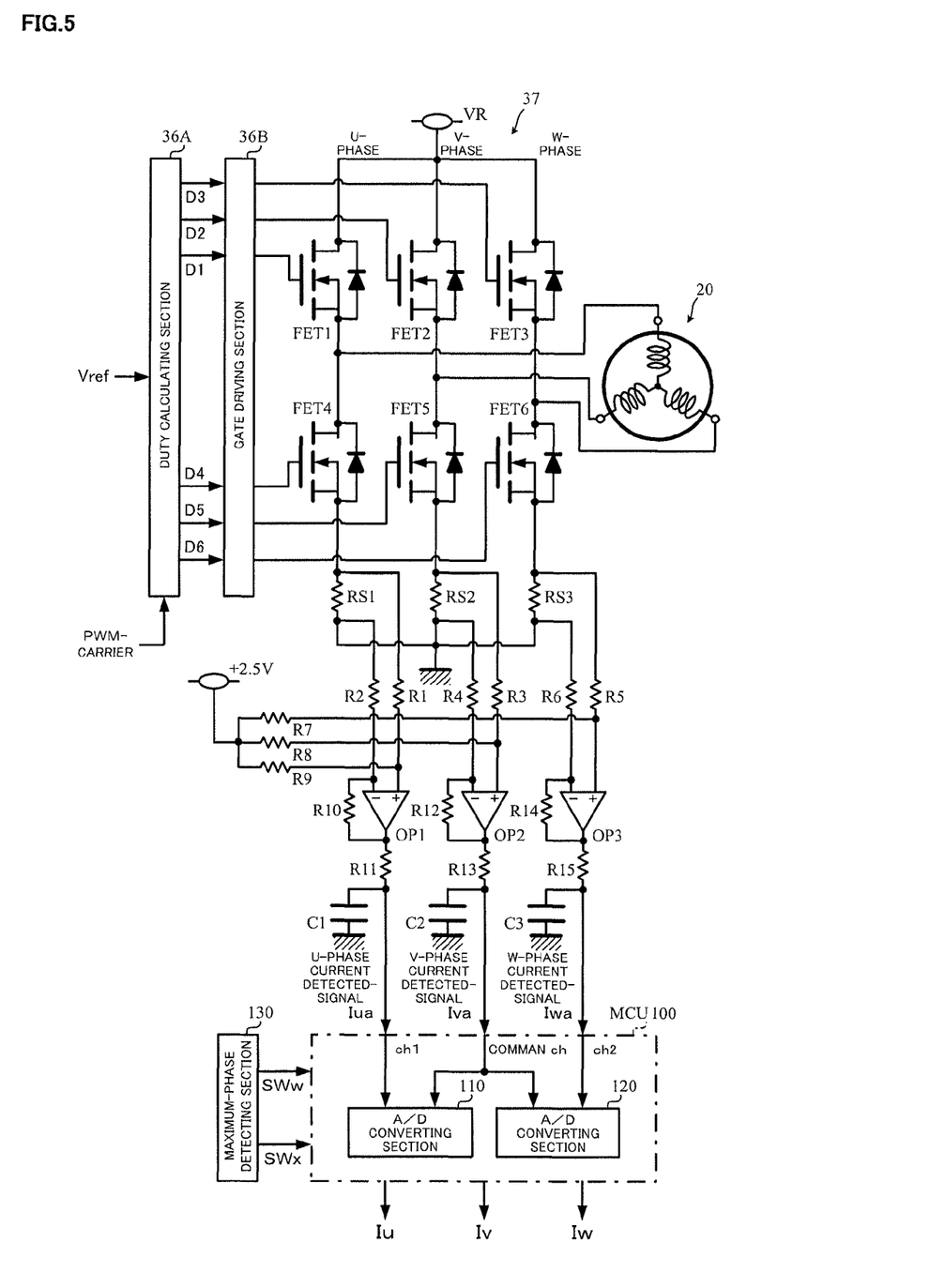
FIG. 5 is a diagram showing a configuration example of the present invention.

FIG. 5 shows a configuration example of the present invention in correspondence to FIGS. 3 and 4, shunt resistances RS1 to RS3 are connected to three-phase downstream sides in the inverter 37 and current detecting circuits are respectively connected to the shunt resistances RS1 to RS3. Operational amplifiers OP1, OP2, OP3 to convert fall voltages falling due to the following currents into current values and to detect, are respectively connected to two end portions of the shunt resistances RS1 to RS3 through input resistances R1 and R2, R3 and R4, R5 and R6. Further, feedback resistances R10, R12, R14 are respectively connected to the operational amplifiers OP1, OP2, OP3, and balance resistances R7, R8, R9 being connected to a power source (+2.5V) are respectively connected to input terminals of the operational amplifiers OP1, OP2, OP3. The currents flowing the shunt resistances RS1 to RS3 are detected by calculating operations of the operational amplifiers OP1, OP2, OP3 and the connected resistances.

Low pass filters (LPFs) which respectively comprise a resistance R11 and a capacitor C1, a resistance R13 and a capacitor C2 and a resistance R15 and a capacitor C3, are provided at output sections of the respective current detecting circuits, and current detected-signals Iua, Iva, Iwa outputted from the respective current detecting circuits are inputted into the MCU 100 through the respective LPFs. The current detected-signals Iua, Iva, Iwa removed noises are inputted into the MCU 100. There are provided two A/D converting units 110 and 120 within the MCU 100, and the A/D converting units 110 and 120 have a common channel (ch) inputting the current detected-signal Iva. A channel ch1 inputting the current detected-signal Iua is connected to the A/D converting unit 110, and a channel ch2 inputting the current detected-signal Iwa is connected to the A/D converting unit 120.

A maximum-phase detecting section 130 to detect a maximum phase of the duties and to output a switching signal SWx and SWw, is connected to the MCU 100, and the 3-phase motor current detected-values Iu, Iv, Iw are outputted from the MCU 100. The respective phase duties calculated in the duty calculating section 36A are inputted into the maximum-phase detecting section 130.

Figure 6:
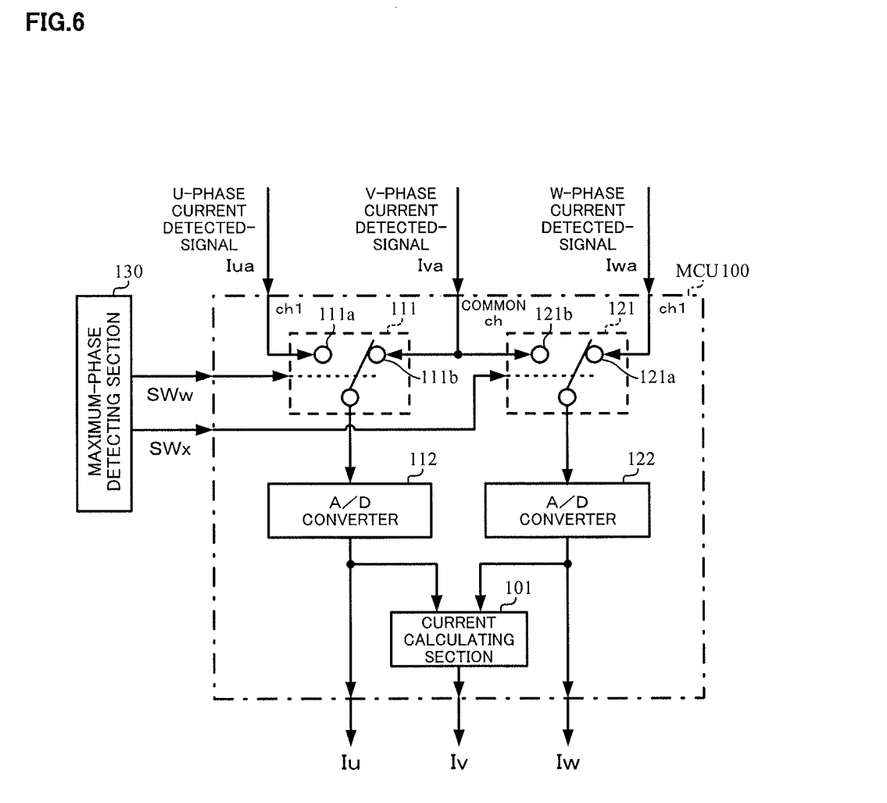
FIG. 6 is a diagram showing a configuration example of MCU according to the present invention.

The detail configuration of the MCU 100 is shown in FIG. 6, and the A/D converting unit 110 comprises a switching section 111 and an A/D converter 112 and the A/D converting unit 120 does a switching section 121 and an A/D converter 122. The switching sections 111 and 121 are respectively switched by switching signals SWx and SWw from the maximum-phase detecting section 130. The motor current detected-values sampled by the A/D converters 112 and 122 are respectively inputted into the current calculating section 101, and another one-phase motor current detected-value is calculated due to the sum value of three-phase signals is "0" and is outputted. As a result, the 3-phase motor current detected-values Iu, Iv, Iw are outputted from the MCU 100.

Figure 7:
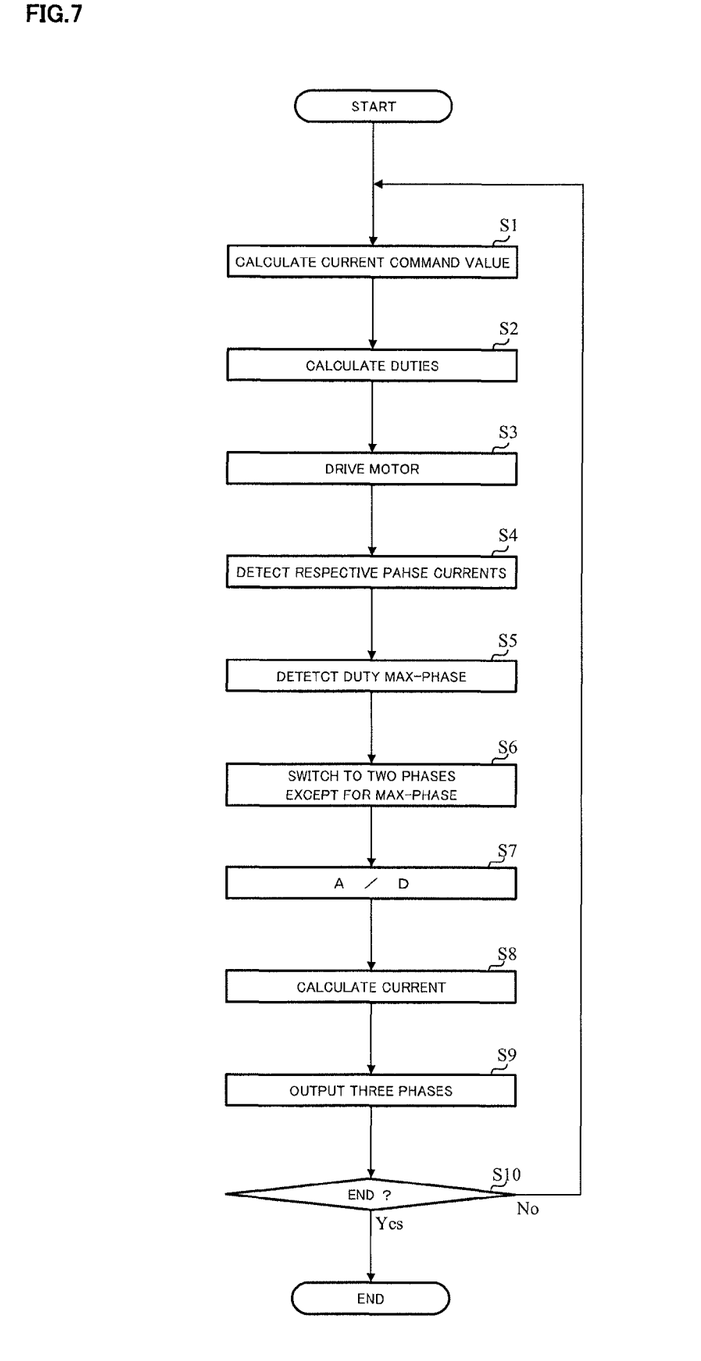
FIG. 7 is a flow chart showing an operation example of the present invention.

In such a configuration, the operational example will be described with reference to a flow chart of FIG. 7.

First, the current command value is calculated based on the steering torque and the vehicle speed (Step S1), the duties for the PWM-control are calculated described above (Step S2), and the motor 20 is driven by the inverter 37 (Step S3). Since the currents flow in the shunt resistances RS1 to RS3 being connected to the down-stream of the inverter 37 due to the driving of the motor 20 by the inverter 37, the current detected-signals Iua, Iva, Iwa are obtained in the respective current detecting circuits and are inputted into the MCU 100 (Step S4).

The maximum-phase detecting section 130 detects the maximum-phase of the duties of the High-side FETs based on the respective duties calculated in the duty calculating section 36A (Step S5), and outputs the switching signals SWx and SWw to switch the switching sections 111 and 121 into two phases except for the duty maximum phase (Step S6). Since the duty maximum phase of the High-side FETs is a phase that an ON-time of the Low-side FETs is the minimum, the duty maximum-phase is detected and the two phases except for the duty maximum phase are simultaneously sampled (Step S7).

That is, since the V-phase and the W-phase except for the U-phase are simultaneously sampled when the U-phase is the duty maximum phase, the maximum-phase detecting section 130, by the switching signals SWx and SWw, inputs the V-phase current detected signal Iva into the A/D converter 112 by switching the contact of the switching section 111 into "111b" and inputs the W-phase current detected signal Iwa into the A/D converter 122 by switching the contact of the switching section 121 into "121a". Further, since the U-phase and the W-phase except for the V-phase are simultaneously sampled when the V-phase is the duty maximum phase, the maximum-phase detecting section 130, by the switching signals SWx and SWw, inputs the U-phase current detected signal Iua into the A/D converter 112 by switching the contact of the switching section 111 into "111a" and inputs the W-phase current detected signal Iwa into the A/D converter 122 by switching the contact of the switching section 121 into "121a". Furthermore, since the U-phase and the V-phase except for the W-phase are simultaneously sampled when the W-phase is the duty maximum phase, the maximum-phase detecting section 130, by the switching signals SWx and SWw, inputs the U-phase current detected signal Iua into the A/D converter 112 by switching the contact of the switching section 111 into "111a" and inputs the V-phase current detected signal Iva into the A/D converter 122 by switching the contact of the switching section 121 into "121b".

Thus, the two-phase current detected-signals except for the duty maximum phase are inputted into the two A/D converters 112 and 122 and are simultaneously A/D-converted (Step S7), and the two-phase motor current detected-values are obtained. Then, a current of another rest one-phase is calculated based on the two-phase motor current detected-values (Step S8), and the 3-phase motor current detected-values Iu, Iv, Iw are outputted from the MCU 100 (Step S9). The above operation is repeated till the judgment of the end (Step S10).

Figure 8A:
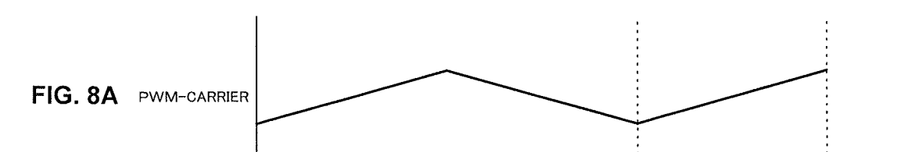
FIGS. 8A, 8B and 8C are a time chart showing an operation example of the present invention.
Figure 8B:
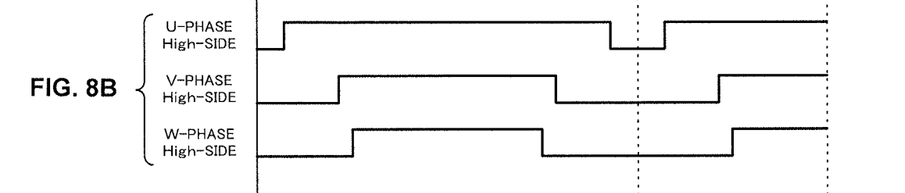
Figure 8C:
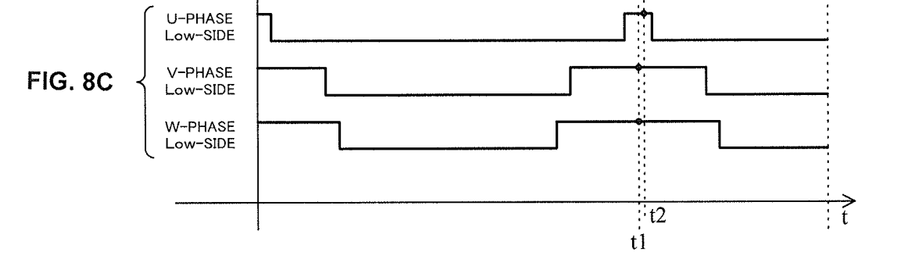

FIG. 8 shows a sampling example of the current detection, the samplings of the two-phases, the V-phase and the W-phase, except for the U-phase which the duty of the High-side FETs is maximum are performed at a time point t1 and the motor current detected-values of the U-phase and the W-phase are obtained. At a late time point t2, the rest one-phase current is calculated in the current calculating section 101 based on the motor current detected-values of the V-phase and the W-phase. FIGS. 8(B) and 8(C) show ON/OFF-state of the respective FETs of High-side and Low-side, level low side is "OFF" and level high-side is "ON".

As stated above, in the current detecting system of the down-stream 3-shunt, at a timing when Low-side FETs are "ON", two-phase currents except for the phase that High-side FETs is the maximum phase are simultaneously sampled and detected.

Further, the A/D converters and the switching sections may be physically separated or be in one unit even they have A/D converting function and switching function.

EXPLANATION OF REFERENCE NUMERALS 1 handle
2 column shaft (steering shaft, handle shaft)
10 torque sensor
12 vehicle speed sensor
14 steering angle sensor
20 motor
30 control unit (ECU)
100 MCU
101 current calculating section
110, 120 A/D converting unit
112, 122 A/D converter
104 current control section
111 switching section
130 maximum-phase detecting section

The invention claimed is:

1. An electric power steering apparatus that calculates a current command value due to at least a steering torque, performs a PWM-control of a 3-phase motor through an inverter based on said current command value, and assist-controls a steering system of a vehicle by detecting currents of said 3-phase motor and feed-backing, comprising:
 a current detecting circuit to detect 3-phase currents of down-stream 3-shunts of said inverter; and
 two A/D converting units having a common channel and inputting 3-phase current detected-signals from said current detecting circuit;
 wherein said electric power steering apparatus includes a current detecting system that any one of said 3-phase current detected-signals is inputted into said common channel and current detected-signals of rest 2-phase are respectively inputted into other channel of said A/D converting units.

2. The electric power steering apparatus according to claim 1, wherein said electric power steering apparatus further including a maximum-phase detecting section to detect a duty maximum-phase of said PWM-control and a switching section to switch inputs into said two A/D converting units of said 3-phase current detected-signals,
 wherein said switching section is switched based on a detection result of said maximum-phase detecting section, and two signals of said 3-phase current detected-signals corresponding to two phases except for said maximum-phase are respectively inputted into two A/D converters within said two A/D converting units and simultaneously sampled.

3. The electric power steering apparatus according to claim 2,
 wherein a current of another one phase from said 2-phase current detected-signals is calculated, and motor current detected-values of three phases are outputted.

4. The electric power steering apparatus according to claim 3,
 wherein said current detecting circuits respectively comprise an operational amplifier and resistance circuits to convert fall currents of down-stream shunt-resistances into current values and to output said current detected-signals.

5. The electric power steering apparatus according to claim 3, wherein low pass filters (LPFs) are connected to respective output sections of said 3-phase current detected-signals.

6. The electric power steering apparatus according to claim 2,
wherein said current detecting circuits respectively comprise an operational amplifier and resistance circuits to convert fall currents of down-stream shunt-resistances into current values and to output said current detected-signals.

7. The electric power steering apparatus according to claim 2, wherein low pass filters (LPFs) are connected to respective output sections of said 3-phase current detected-signals.

8. The electric power steering apparatus according to claim 1,
wherein a current of another one phase from said 2-phase current detected-signals is calculated, and motor current detected-values of three phases are outputted.

9. The electric power steering apparatus according to claim 8,
wherein said current detecting circuits respectively comprise an operational amplifier and resistance circuits to convert fall currents of down-stream shunt-resistances into current values and to output said current detected-signals.

10. The electric power steering apparatus according to claim 8, wherein low pass filters (LPFs) are connected to respective output sections of said 3-phase current detected-signals.

11. The electric power steering apparatus according to claim 1,
wherein said current detecting circuits respectively comprise an operational amplifier and resistance circuits to convert fall currents of down-stream shunt-resistances into current values and to output said current detected-signals.

12. The electric power steering apparatus according to claim 1, wherein low pass filters (LPFs) are connected to respective output sections of said 3-phase current detected-signals.

* * * * *